(12) United States Patent
Takeoka (10) Patent No.: US 7,786,536 B2
(45) Date of Patent: Aug. 31, 2010

(54) SEMICONDUCTOR DEVICE AND METHOD FOR FABRICATING THE SAME

(75) Inventor: Shinji Takeoka, Toyama (JP)

(73) Assignee: Panasonic Corporation, Osaka (JP)

( * ) Notice: Subject to any disclaimer, the term of this patent is extended or adjusted under 35 U.S.C. 154(b) by 81 days.

(21) Appl. No.: 11/979,869

(22) Filed: Nov. 9, 2007

(65) Prior Publication Data
US 2008/0179690 A1     Jul. 31, 2008

(30) Foreign Application Priority Data
Jan. 25, 2007  (JP) .............................. 2007-014553

(51) Int. Cl.
*H01L 23/62*  (2006.01)
(52) U.S. Cl. .................. 257/381; 257/384; 257/903
(58) Field of Classification Search ................. 257/381, 257/384, 903
See application file for complete search history.

(56) References Cited
U.S. PATENT DOCUMENTS
5,847,434 A * 12/1998 Onozawa ................... 257/381
6,077,731 A * 6/2000 Yamazaki et al. ........... 438/150

FOREIGN PATENT DOCUMENTS
JP     2005-79255     3/2005

* cited by examiner

*Primary Examiner*—Howard Weiss
*Assistant Examiner*—Steven H Rao
(74) *Attorney, Agent, or Firm*—McDermott Will & Emery LLP (57) ABSTRACT

In a semiconductor device, a first p-type MIS transistor includes: a first gate insulating film formed on a first active region; a first gate electrode formed on the first gate insulating film; a first side-wall insulating film; a first p-type source/drain region; a first contact liner film formed over the first active region; a first interlayer insulating film formed on the first contact liner film; and a first contact plug formed to reach the top surface of the first source/drain region. The first contact liner film has a slit extending, around a corner at which the side surface of the first side-wall insulating film intersects the top surface of the first active region, from the top surface of the first contact liner film toward the corner.

13 Claims, 10 Drawing Sheets

SEMICONDUCTOR DEVICE AND METHOD FOR FABRICATING THE SAME

BACKGROUND OF THE INVENTION (a) Fields of the Invention

The present invention relates to field effect transistors capable of effectively supplying hydrogen to a gate insulating film during hydrogen sintering, and to fabrication methods thereof.

(b) Description of Related Art

With shrinking of design rules of semiconductor devices, circuit integration thereof dramatically increases, which in turn enables incorporation of more than one hundred million field effect (Metal Insulator Semiconductor) transistors on one chip. In order to fabricate such a chip, strong demand is made of not only advancement of ultrafine processing technologies, such as lithography and etching, which require processing accuracy on the order of several tens of nanometers, but also technological development for improving a margin of processing size or alignment deviation.

As one of the techniques for improving the margin of processing size or alignment deviation, a SAC (Self Aligned Contact hole) method in a contact plug formation process is often employed as an effective method. This is the method for improving the margin in the manner in which a gate electrode is fully covered with a silicon nitride film to provide a high etching selectivity with respect to a silicon oxide film constituting an interlayer film for the contact plug.

Figure 10:
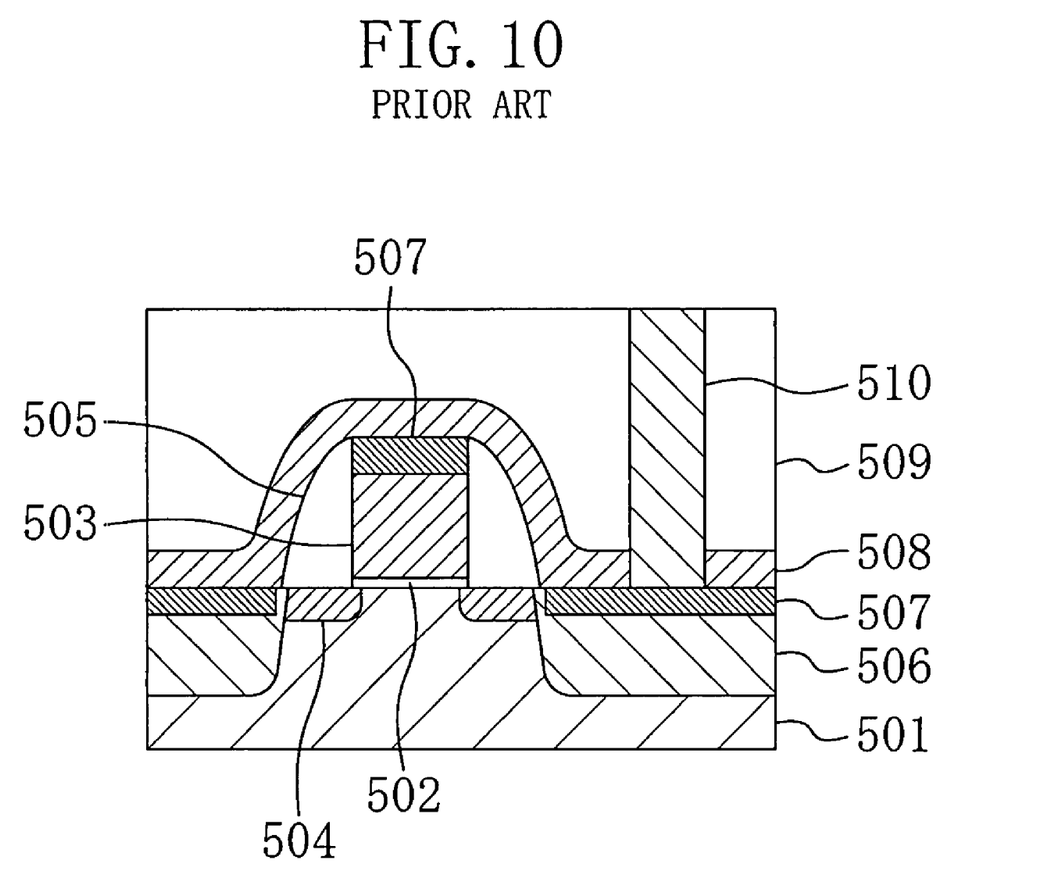
FIG. 10 is a sectional view showing main components of the structure of a conventional semiconductor device.

FIG. 10 shows a cross-sectional structure of a conventional semiconductor device including a transistor formed by a SAC method.

Referring to FIG. 10, above a semiconductor substrate 501, a gate electrode 503 having a silicide layer 507 in its upper portion is formed with a gate insulating film 502 interposed therebetween. A p-type source/drain region 504 with a shallow junction depth is formed in a region of the semiconductor substrate 501 located below each side of the gate electrode 503. A sidewall 505 is formed on side surfaces of the silicide layer 507, the gate electrode 503, and the gate insulating film 502. In a region of the semiconductor substrate 501 located below an outer side of the sidewall 505, a p-type source/drain region 506 with a great junction depth is formed which has a silicide layer 507 in its upper portion. Over the entire surface of the semiconductor substrate 501, a contact liner film 508 of a silicon nitride film is formed to cover the gate electrode 503 and the sidewall 505. An interlayer insulating film 509 of a silicon oxide film is formed on the contact liner film 508. In the interlayer insulating film 509 and the contact liner film 508, a contact plug 510 is formed which penetrates the interlayer insulating film 509 and the contact liner film 508 and of which the bottom end reaches the silicide layer 507.

The structure described above can be employed to improve an etching margin in forming the contact plug 510. To be more specific, in forming a contact hole for formation of the contact plug 510, the contact hole formation process is divided into two steps composed of: the step of etching, using the contact liner film 508 as an etch stop film, the silicon oxide film constituting the interlayer insulating film 509; and the subsequent step of etching the contact liner film 508. Thereby, even though an excessive amount of etching is performed on the silicon oxide film, additional etching performed on the sidewall 505 or the semiconductor substrate 501 can be blocked.

However, when the SAC structure is employed in which the contact liner film 508 of a silicon nitride film is formed to fully cover the gate electrode 503, hydrogen supply to the gate insulating film becomes difficult in a hydrogen sintering process for recovering damages in the gate insulating film 502. This causes a trouble that the reliability of the transistor, in particular NBTI (Negative Bias Temperature Instability) of the p-channel MIS transistor deteriorates. Specifically, since the silicon nitride film constituting the contact liner film 508 has a very strong effect of blocking hydrogen, only hydrogen passing through the contact plug 510 is supplied to the gate insulating film 502 in the hydrogen sintering. Thus, the absolute amount of hydrogen supplied to the gate insulating film 502 becomes very small, which makes it difficult to recover damages in the gate insulating film 502. Therefore, the threshold voltage of the PMIS transistor fluctuates with time.

To deal with this trouble, another approach to effectively recovering damages in the gate insulating film 502 even in the case of using a silicon nitride film as the contact liner film 508 is proposed (see, for example, Japanese Unexamined Patent Publication No. 2005-79255). In this approach, a contact liner film is formed of a silicon nitride film containing a great amount of hydrogen, and then the film is subjected to thermal annealing to supply hydrogen from the silicon nitride film to the gate insulating film 502, thereby recovering damages in the gate insulating film 502.

For the approach described in the aforementioned Japanese Unexamined Patent Publication No. 2005-79255, however, the amount of hydrogen supplied to the gate insulating film is limited to the amount of hydrogen contained in the contact liner film. In order to advance transistor miniaturization, it is also necessary to reduce the thickness of the contact liner film. Thus, for a fine transistor, the amount of hydrogen supplied to a gate insulating film decreases, which disadvantageously makes it difficult to recover damages in the gate insulating film.

SUMMARY OF THE INVENTION

In view of the foregoing, an object of the present invention is to provide a semiconductor device including a contact liner film and having a structure capable of effectively supplying hydrogen to a gate insulating film, and also to provide a fabrication method thereof.

To attain the above object, a semiconductor device according to one aspect of the present invention is a semiconductor device including a first p-type MIS transistor over a first active region of a semiconductor substrate. In this device, the first p-type MIS transistor includes: a first gate insulating film formed on the first active region; a first gate electrode formed on the first gate insulating film; a first side-wall insulating film formed on a side surface of the first gate electrode; a first p-type source/drain region in the first active region outside the first side-wall insulating film; a first contact liner film formed over the first active region to cover the first gate electrode and the first side-wall insulating film; a first interlayer insulating film formed on the first contact liner film; and a first contact plug formed to penetrate the first interlayer insulating film and the first contact liner film and reach the top surface of the first source/drain region, and the first contact liner film has a slit extending, around a corner at which the side surface of the first side-wall insulating film intersects the top surface of the first active region, from the top surface of the first contact liner film toward the corner.

In the semiconductor device according to one aspect of the present invention, the first side-wall insulating film includes: an L-shaped insulating film with an L-shaped cross section formed on the side surface of the first gate electrode and the top surface of the first active region; and a sidewall formed on the inner surface of the L-shaped insulating film.

The semiconductor device according to one aspect of the present invention further includes a first silicide layer formed in an upper portion of the first p-type source/drain region, and the first contact plug is formed to reach the first silicide layer.

The semiconductor device according to one aspect of the present invention further includes a second p-type MIS transistor over a second active region of the semiconductor substrate, the second active region differing from the first active region. In this device, the second p-type MIS transistor includes: a second gate insulating film formed on the second active region; a second gate electrode formed on the second gate insulating film; a second side-wall insulating film formed on a side surface of the second gate electrode; a second p-type source/drain region in the second active region outside the second side-wall insulating film; a second contact liner film formed over the second active region to cover the second gate electrode and the second side-wall insulating film; a second interlayer insulating film formed on the second contact liner film; and a second contact plug formed to penetrate the second interlayer insulating film and the second contact liner film and reach the top surface of the second source/drain region and the side surface of the second side-wall insulating film. The first contact plug is formed to reach only the top surface of the first source/drain region, and the second contact liner film has no slit extending, around a corner at which the side surface of the second side-wall insulating film intersects the top surface of the second active region, from the top surface of the second contact liner film toward the corner.

The semiconductor device according to one aspect of the present invention further includes a second silicide layer formed in an upper portion of the second p-type source/drain region, and the second contact plug is formed to reach the second silicide layer.

In the semiconductor device according to one aspect of the present invention, the first contact liner film is made of a silicon nitride film.

In the semiconductor device according to one aspect of the present invention, the first contact liner film is made of a silicon nitride film containing hydrogen.

A method for fabricating a semiconductor device according to one aspect of the present invention includes: the step (a) of forming a first gate insulating film on a first active region of a semiconductor substrate; the step (b) of forming a first gate electrode on the first gate insulating film; the step (c) of forming a first side-wall insulating film on a side surface of the first gate electrode; the step (d) of forming a first p-type source/drain region in the first active region outside the first side-wall insulating film; the step (e) of forming a first contact liner film over the first active region to cover the first gate electrode and the first side-wall insulating film; the step (f) of forming a slit in the first contact liner film, the slit extending, around a corner at which the side surface of the first side-wall insulating film intersects the top surface of the first active region, from the top surface of the first contact liner film toward the corner; the step (g) of forming, after the step (f), a first interlayer insulating film on the first contact liner film; the step (h) of forming a first contact plug to penetrate the first interlayer insulating film and the first contact liner film and reach the top surface of the first source/drain region; and the step (i) of subjecting, after the step (h), the semiconductor substrate to a thermal annealing in a hydrogen atmosphere.

The method for fabricating a semiconductor device according to one aspect of the present invention further includes, after the step (d) and before the step (e), the step (j) of forming a first silicide layer on the first p-type source/drain region, and in the step (h), the first contact plug is formed to reach the first silicide layer.

In the method for fabricating a semiconductor device according to one aspect of the present invention, the step (a) further includes the step of forming a second gate insulating film on a second active region of a semiconductor substrate, the second active region differing from the first active region, the step (b) further includes the step of forming a second gate electrode on the second gate insulating film, the step (c) further includes the step of forming a second side-wall insulating film on a side surface of the second gate electrode, the step (d) further includes the step of forming a second p-type source/drain region in the second active region outside the second side-wall insulating film, the step (e) further includes the step of forming a second contact liner film over the second active region to cover the second gate electrode and the second side-wall insulating film, the step (g) further includes the step of forming a second interlayer insulating film on the second contact liner film, the step (h) is the step of forming the first contact plug to reach only the top surface of the first source/drain region, and also a second contact plug to penetrate the second interlayer insulating film and the second contact liner film and reach the top surface of the second source/drain region and the side surface of the second side-wall insulating film, and the second contact liner film has no slit extending, around a corner at which the side surface of the second side-wall insulating film intersects the top surface of the second active region, from the top surface of the second contact liner film toward the corner.

In the method for fabricating a semiconductor device according to one aspect of the present invention, the step (e) is the step of forming the first contact liner film made of a silicon nitride film.

In the method for fabricating a semiconductor device according to one aspect of the present invention, the step (e) is the step of forming the second contact liner film made of a silicon nitride film containing hydrogen.

In the method for fabricating a semiconductor device according to one aspect of the present invention, in the step (f), the first contact liner film is subjected to ultraviolet irradiation to form the slit in the first contact liner film.

With the present invention, even in the case where a silicon nitride film is used as the contact liner film, a sufficient amount of hydrogen can be supplied to the gate insulating film to effectively recover damages in the gate insulating film.

DETAILED DESCRIPTION OF THE PREFERRED EMBODIMENTS

First Embodiment

Hereinafter, the structure of a semiconductor device according to a first embodiment of the present invention will be described with reference to the accompanying drawings.

Figure 1:
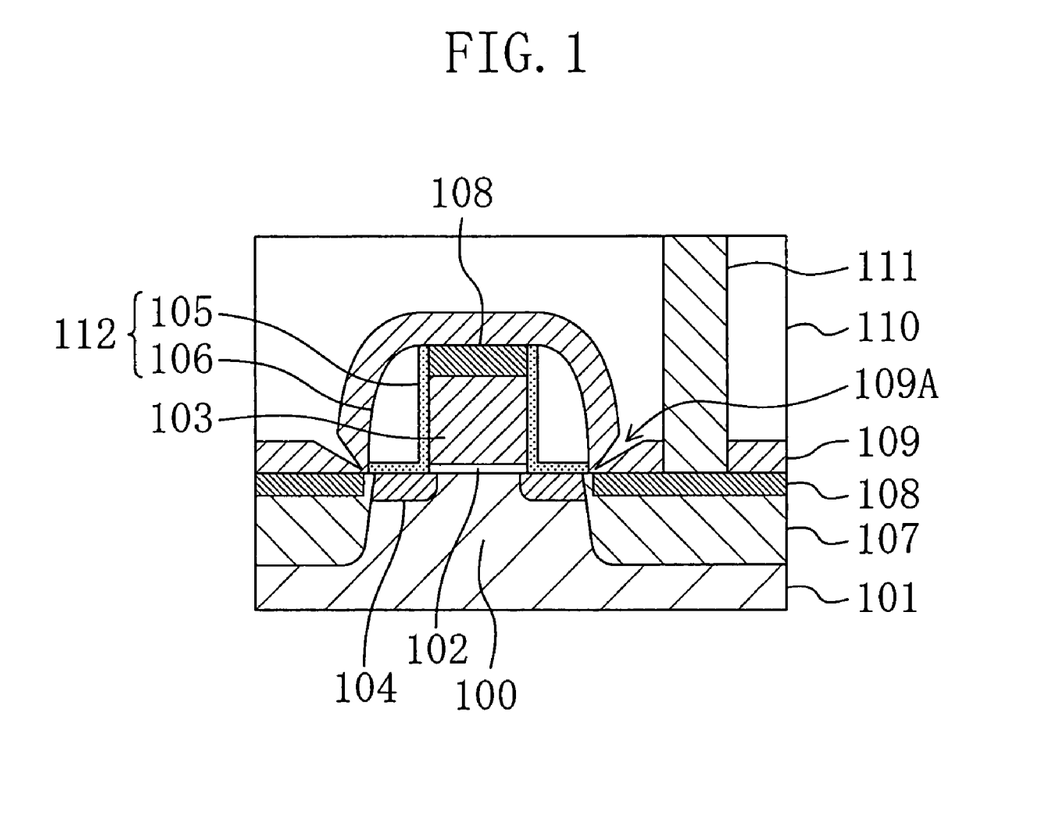
FIG. 1 is a sectional view showing main components of the structure of a semiconductor device according to a first embodiment of the present invention.

FIG. 1 is a sectional view showing main components of the structure of the semiconductor device according to the first embodiment of the present invention.

Referring to FIG. 1, in a semiconductor substrate 101 of silicon or the like, an active region 100 is formed which is surrounded by an isolation region (not shown) and formed with an n-well (not shown). Above the active region 100, a gate electrode 103 having a thickness of about 120 nm is formed with a gate insulating film 102 with a thickness of about 2 nm interposed therebetween. The gate electrode 103 has, in its upper layer, a silicide layer 108 of NiSi or the like having a thickness of about 20 nm. Note that the gate length of the gate electrode 103 is set at about 50 nm. In a portion of the active region 100 located below each side of the gate electrode 103, a p-type source/drain region (a p-type extension region or a p-type LDD region) 104 with a shallow junction depth is formed which has a p-type impurity such as boron or indium injected thereinto.

On the side surfaces of the silicide layer 108, the gate electrode 103, and the gate insulating film 102 and over the active region 100, an L-shaped insulating film (an L-shaped sidewall) 105 with an L-shaped cross section is formed which is made of $SiO_2$ or the like and has a thickness of about 20 nm. On the inner surface of the L-shaped insulating film 105, a sidewall 106 of $Si_3N_4$ or the like is formed which has a bottom width of about 50 nm. The L-shaped insulating film 105 and the sidewall 106 constitute a sidewall spacer 112 (a first side-wall insulating film). Note that the sidewall 106 may be formed of, for example, a stacked film composed of $SiO_2$ and $Si_3N_4$. In a portion of the active region 100 located below an outer side of the sidewall spacer 112, a p-type source/drain region 107 is formed which has a p-type impurity such as boron or indium injected thereinto and has a greater junction depth than the p-type source/drain region 104. The p-type source/drain region 107 has, in its upper layer, a silicide layer 108 with a thickness of about 20 nm.

Over the semiconductor substrate 101, a contact liner film 109 of a silicon nitride film with a thickness of 25 nm is formed to cover the gate electrode 103 and the sidewall spacer 112. The contact liner film 109 has a slit 109A, and the slit 109A is formed so that around a corner at which the side surface of the sidewall spacer 112 composed of the L-shaped insulating film 105 and the sidewall 106 intersects the top surface of the active region 100, it extends from the top surface of the contact liner film 109 toward the corner.

On the contact liner film 109 including the inside of the slit 109A, an interlayer insulating film 110 with a thickness of about 500 nm is formed which is made of, for example, a silicon oxide film typified by a TEOS (tetraethylorthosilicate) film and which has a planarized top surface. The interlayer insulating film 110 and the contact liner film 109 are formed with a contact plug 111 which penetrates these films and of which the bottom end reaches the silicide layer 108 in the upper portion of the p-type source/drain region 107.

A method for fabricating a semiconductor device according to the first embodiment of the present invention will be described below with reference to the accompanying drawings.

FIGS. 2A to 2C, 3A, and 3B are sectional views showing main process steps of the method for fabricating a semiconductor device according to the first embodiment of the present invention in the order of its fabrication steps.

Figure 2A:
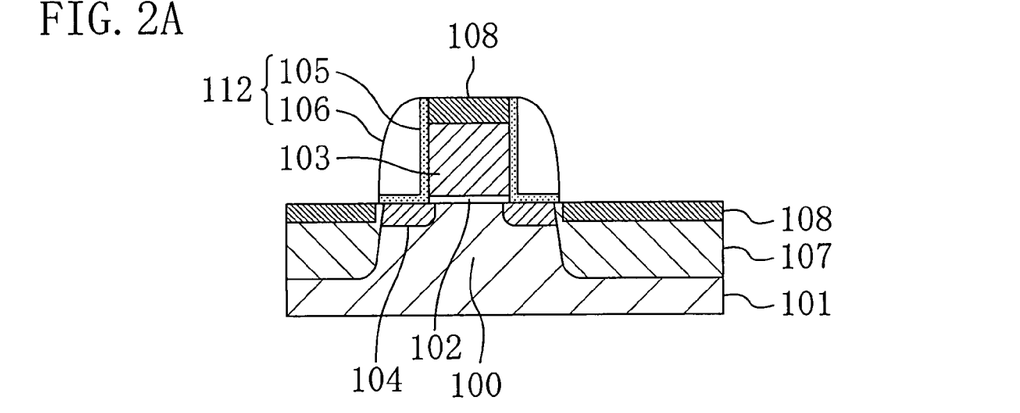
FIGS. 2A to 2C are sectional views showing main process steps of a method for fabricating a semiconductor device according to the first embodiment of the present invention in the order of its fabrication steps.

Referring to FIG. 2A, first, in the semiconductor substrate 101 of silicon or the like, the isolation region (not shown) is selectively formed by, for example, an STI (shallow trench isolation) method. In a region surrounded with the isolation region, the n-well (not shown) is formed by an ion implantation method to provide the active region 100. Subsequently, on the active region 100, a gate-insulating-film formation film is formed which is made of, for example, a SiON-based film and has a thickness of about 2 nm, and then a gate-electrode formation film is formed which is made of polysilicon or the like and has a thickness of about 120 nm. Using lithography and dry etching techniques, the gate-insulating-film formation film is formed into the gate insulating film 102, and the gate-electrode formation film is formed into the gate electrode 103. Note that the gate length of the gate electrode 103 is set at about 50 nm.

Next, using the gate electrode 103 as a mask, boron ions as a p-type impurity are implanted into the active region 100 on the condition of, for example, an implantation energy of 1 keV and an implantation dose of $1 \times 10^{14}$ ions/cm$^2$, thereby forming the p-type source/drain region 104 with a shallow junction depth.

Subsequently, over the entire surface of the semiconductor substrate 101, a first insulating film of $SiO_2$ or the like having a thickness of about 20 m and a second insulating film of $Si_3N_4$ or the like having a thickness of about 50 nm are sequentially formed to cover the gate electrode 103. The second insulating film and the first insulating film are sequentially etched back to form the L-shaped insulating film 105 and the sidewall 106 over the side surfaces of the gate insulating film 102 and the gate electrode 103. The L-shaped insulating film 105 is made of the first insulating film and has an L-shaped cross section. The sidewall 106 is made of the second insulating film and formed to cover the inner surface of the L-shaped insulating film 105. In the manner described above, the L-shaped insulating film 105 and the sidewall 106 constitute the sidewall spacer 112. The sidewall 106 may be formed of, for example, a stacked film of $SiO_2$ and $Si_3N_4$.

Using the gate electrode 103 and the sidewall spacer 112 as a mask, boron ions as a p-type impurity are implanted into an area of the active region 100 located below an outer side of the sidewall spacer 112 on the condition of, for example, an implantation energy of 3 keV and an implantation dose of $1\times10^{15}$ ions/cm$^2$, thereby forming the p-type source/drain region 107 having a greater junction depth than the p-type source/drain region 104.

Next, over the entire surface of the semiconductor substrate 101, a metal film of cobalt, nickel, or the like is deposited to have a thickness of about 20 nm, and then a thermal treatment is performed to allow silicon to react with metal contained in the metal film. Thereby, the silicide layer 108 of NiSi or the like is formed on the surface of the p-type source/drain region 107 located outside the sidewall spacer 112, and the silicide layer 108 is also formed in the upper layer of the gate electrode 103.

Figure 2B:
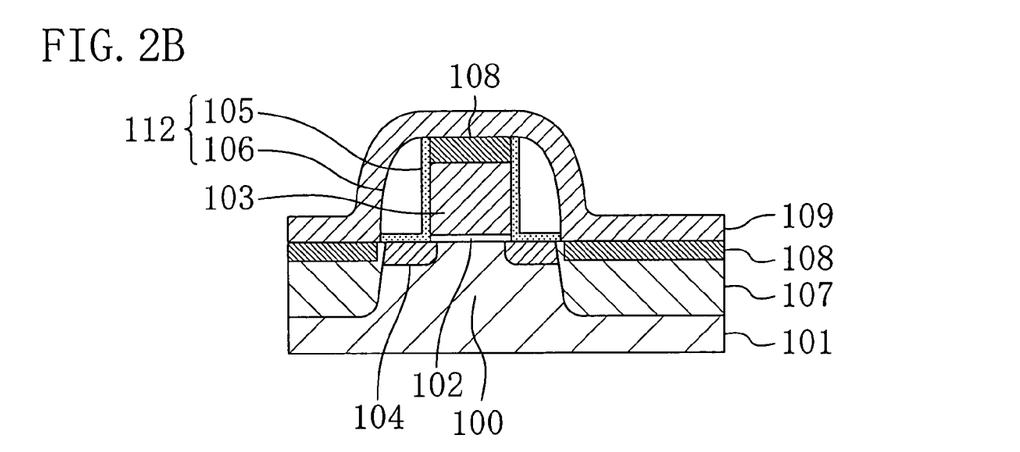

Subsequently, as shown in FIG. 2B, by a plasma enhanced CVD (chemical vapor deposition) method, the contact liner film 109 of a silicon nitride film having a thickness of 30 nm is deposited over the entire surface of the semiconductor substrate 101. The contact liner film 109 is formed to cover the gate electrode 103 and the sidewall spacer 112.

Figure 2C:
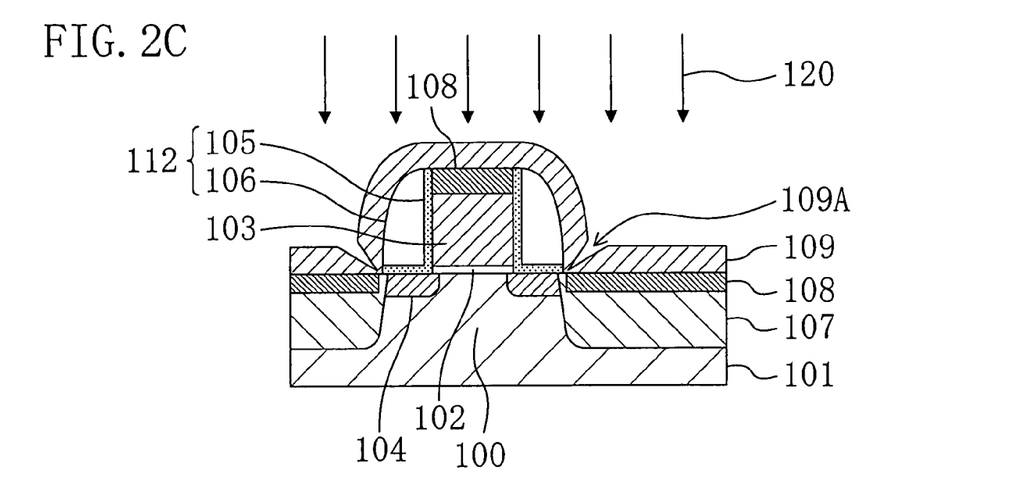

As shown in FIG. 2C, the contact liner film 109 is subjected to ultraviolet irradiation 120 from the upper-surface side using a light source with a wavelength of 200 to 400 nm inclusive, whereby the contact liner film 109 is shrunk to form the slit 109A. To be more specific, the wafer with the above-shown structure fabricated thereon is placed on a stage heated to 450° C., and in a nitrogen atmosphere, the wafer is subjected to ultraviolet irradiation 120 for 15 minutes using a light source with a wavelength of 200 nm. Thereby, the thickness of the contact liner film 109 is shrunk to 25 nm to form the slit 109A. In this process, the slit 109A is formed so that around a corner at which the side surface of the sidewall spacer 112 composed of the L-shaped insulating film 105 and the sidewall 106 intersects the top surface of the active region 100, it extends from the top surface of the contact liner film 109 toward the corner.

In the step shown in FIG. 2B, the slit 109A can also be formed in the manner in which after deposition of the contact liner film 109 at a deposition temperature of 250 to 600° C. inclusive, the temperature of the atmosphere is lowered, without performing ultraviolet irradiation in FIG. 2C, to room temperature to shrink the contact liner film 109. Instead of the ultraviolet irradiation in FIG. 2C, thermal annealing may be performed to form the slit 109A.

Figure 3A:
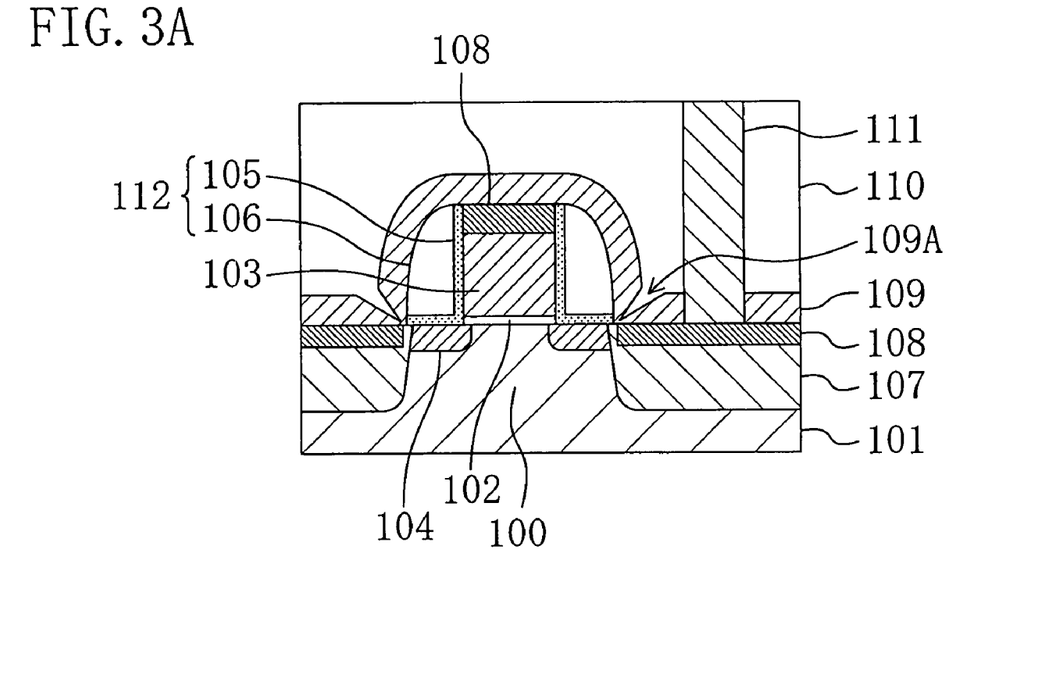
FIGS. 3A and 3B are sectional views showing main process steps of the method for fabricating a semiconductor device according to the first embodiment of the present invention in the order of its fabrication steps.

Next, as shown in FIG. 3A, over the entire surface of the contact liner film 109 including the inside of the slit 109A, a silicon oxide film typified by a TEOS film is deposited to have a thickness of about 500 nm, and the surface of the formed film is planarized by CMP (chemical mechanical polishing). Thereby, the interlayer insulating film 110 is formed which has a thickness of about 350 nm.

Subsequently, by lithography and etching methods, the interlayer insulating film 110 and the contact liner film 109 are formed with a contact hole which penetrates the interlayer insulating film 110 and the contact liner film 109 to expose the surface of the silicide layer 108 in the upper portion of the p-type source/drain region 107. To be more specific, the contact hole formation process is divided into two steps composed of: the step of etching, using the contact liner film 109 as an etch stop film, the silicon oxide film constituting the interlayer insulating film 110; and the subsequent step of etching the contact liner film 109. Thereby, the contact hole can be formed with the sidewall spacer 112 or the semiconductor substrate 101 prevented from being etched. Thereafter, the contact hole is filled with a conductive film of tungsten or the like to form the contact plug 111 of which the bottom end reaches the silicide layer 108.

Figure 3B:
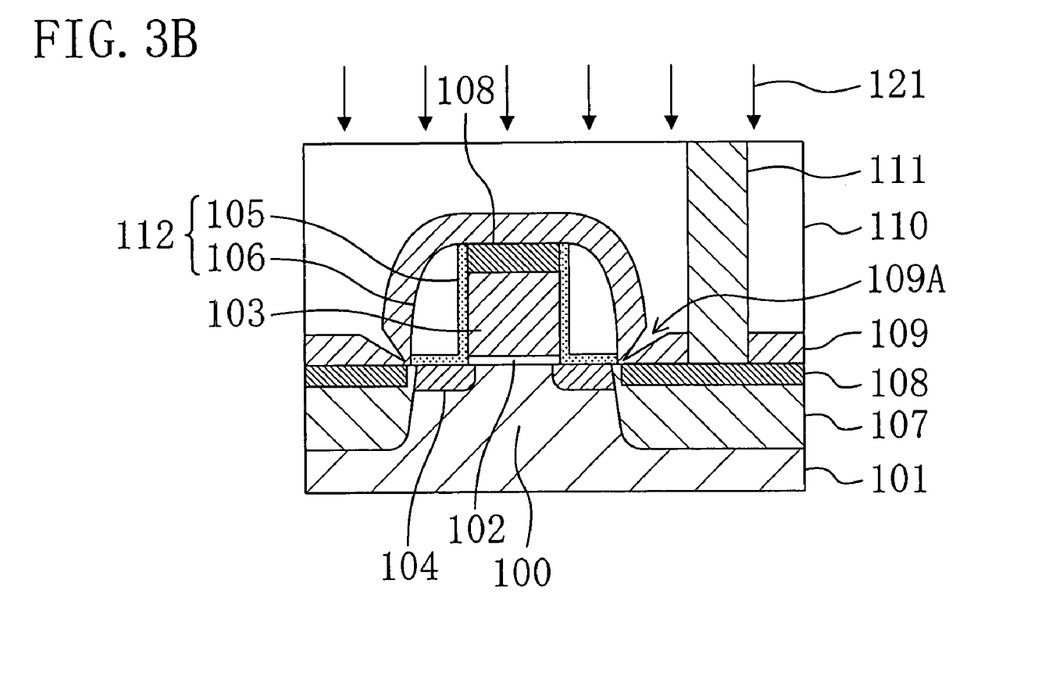

As shown in FIG. 3B, the semiconductor substrate 101 is subjected to thermal annealing (hydrogen sintering) 121 in a hydrogen atmosphere. The hydrogen sintering 121 is performed in an atmosphere of $H_2:N_2=1:1$, at 400° C., and for 30 minutes.

As described above, with the semiconductor device and its fabrication method according to the first embodiment of the present invention, the contact liner film 109 with the slit 109A can be formed to secure, as a hydrogen diffusion path for supplying hydrogen to the gate insulating film 102, not only a hydrogen diffusion path passing through the contact plug 111 to the gate insulating film 102 but also a hydrogen diffusion path passing through the slit 109A, which is formed on the bottom portion of the side surface of the sidewall spacer 112, to the gate insulating film 102. With this structure, in the hydrogen sintering process (see FIG. 3B) carried out after formation of the contact plug 111 in order to recover damages in the gate insulating film 102, hydrogen supply to the gate insulating film 102 can be effectively performed through these hydrogen diffusion paths. This makes it possible to supply hydrogen to the gate insulating film 102 regardless of the thickness of the contact liner film 109. Therefore, even though the contact liner film 109 is made thin, the reliability of the PMIS transistor can be improved especially with NBTI of the PMIS transistor prevented from deteriorating.

In the first embodiment of the present invention, description has been made of the exemplary case where the contact liner film 109 is formed of a silicon nitride film with a thickness of 25 nm. However, it is not limited to the above-shown thickness and material, and alternatively it may be formed of, for example, a silicon nitride film containing hydrogen.

In the first embodiment of the present invention, instead of the sidewall spacer 112 composed of the L-shaped insulating film 105 and the sidewall 106, a sidewall spacer composed of the sidewall 106 alone and having no L-shaped insulating film 105 may be formed. Alternatively, an insulating film (an offset spacer) with an I-shaped cross section may be formed between the gate electrode 103 and the sidewall spacer 112.

Second Embodiment

Next description will be made of a semiconductor device and its fabrication method according to the second embodiment of the present invention as an exemplary application of the first embodiment described above. To be more specific, in the semiconductor device according to the second embodiment, the contact liner film having the slit in the first embodiment is employed in an area for forming a contact plug which penetrates the contact liner film to reach only a source/drain region (including a silicide layer in the upper portion of the source/drain region) of a semiconductor substrate, while the contact liner film having the slit in the first embodiment is not employed, that is, a typical contact liner film is employed in an area for forming a contact plug which penetrates the contact liner film to reach not only the source/drain region (including the silicide layer in the upper portion of the source/drain region) of the semiconductor substrate but also the side surface of the sidewall spacer.

Hereinafter, the structure of the semiconductor device according to the second embodiment of the present invention will be described with reference to the accompanying drawings.

Figure 4:
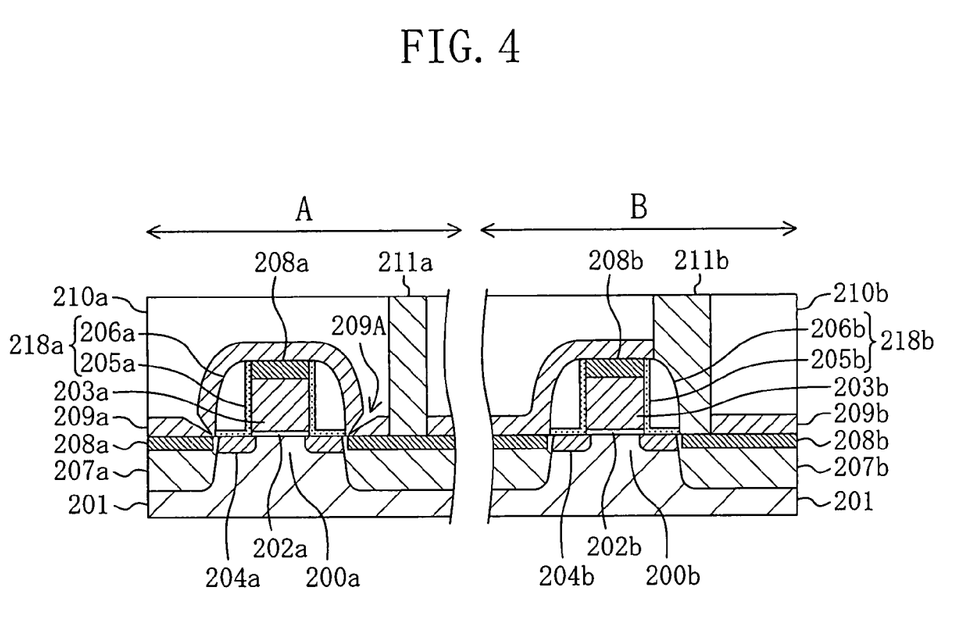
FIG. 4 is a sectional view showing main components of the structure of a semiconductor device according to a second embodiment of the present invention.

FIG. 4 is a sectional view showing main components of the structure of the semiconductor device according to the second embodiment of the present invention. In PMIS transistors shown in a first area A (for example, a logic area) and a second area B (for example, a memory area) on a semiconductor substrate 201 in FIG. 4, although the components thereof have different reference numerals from the corresponding ones of the PMIS transistor shown in FIG. 1, their description is made in the same manner as the description in the first embodiment. Therefore, in the second embodiment, a detailed explanation of them will be simplified, and characteristic points of the structure of the semiconductor device according to the second embodiment will be described mainly.

In the first area A shown in FIG. 4, in the semiconductor substrate 201, a first active region 200a is formed which is surrounded by an isolation region (not shown) and formed with an n-well (not shown). Above the first active region 200a, a first gate electrode 203a having a first silicide layer 208a in its upper layer is formed with a first gate insulating film 202a interposed therebetween. A first p-type shallow source/drain region (a p-type extension region or a p-type LDD region) 204a with a shallow junction depth is formed in a portion of the first active region 200a located below each side of the first gate electrode 203a. A first L-shaped insulating film 205a with an L-shaped cross section is formed on the side surfaces of the first silicide layer 208a, the first gate electrode 203a, and the first gate insulating film 202a and over the first active region 200a, and a first sidewall 206a is formed on the inner surface of the first L-shaped insulating film 205a. The first L-shaped insulating film 205a and the first sidewall 206a constitute a first sidewall spacer 218a (a first side-wall insulating film). Note that the first sidewall 206a may be formed of a stacked film. In a portion of the first active region 200a located below an outer side of the first sidewall spacer 218a, a first p-type deep source/drain region 207a is formed which has a greater junction depth than the first p-type shallow source/drain region 204a and has a first silicide layer 208a in the upper layer.

Over the semiconductor substrate 201, a first contact liner film 209a of a silicon nitride film having a slit 209A is formed to cover the first gate electrode 203a and the first sidewall spacer 218a. In this structure, the slit 209A is formed so that around a corner at which the side surface of the first sidewall spacer 218a composed of the first L-shaped insulating film 205a and the first sidewall 206a intersects the top surface of the first active region 200a, it extends from the top surface of the first contact liner film 209a toward the corner. The first contact liner film 209a has a thickness of 25 nm.

A first interlayer insulating film 210a is formed on the first contact liner film 209a including the inside of the slit 209A. The first interlayer insulating film 210a is formed with a first contact plug 211a penetrating the first interlayer insulating film 210a and the first contact liner film 209a to reach the top surface of the semiconductor substrate 201 (to be more specific, the top surface of the first silicide layer 208a located in the upper layer of the first p-type deep source/drain region 207a).

On the other hand, in the second area B shown in FIG. 4, in the semiconductor substrate 201, a second active region 200b is formed which is surrounded by an isolation region (not shown) and formed with an n-well (not shown). Above the second active region 200b, a second gate electrode 203b having a second silicide layer 208b in its upper layer is formed with a second gate insulating film 202b interposed therebetween. A second p-type shallow source/drain region (a p-type extension region or a p-type LDD region) 204b with a shallow junction depth is formed in a portion of the second active region 200b located below each side of the second gate electrode 203b. A second L-shaped insulating film 205b with an L-shaped cross section is formed on the side surfaces of the second silicide layer 208b, the second gate electrode 203b, and the second gate insulating film 202b and over the second active region 200b, and a second sidewall 206b is formed on the inner surface of the second L-shaped insulating film 205b. The second L-shaped insulating film 205b and the second sidewall 206b constitute a second sidewall spacer 218b (a second side-wall insulating film). Note that the second sidewall 206a may be formed of a stacked film. In a portion of the second active region 200b located below an outer side of the second sidewall spacer 218b, a second p-type deep source/drain region 207b is formed which has a greater junction depth than the second p-type shallow source/drain region 204b and has a second silicide layer 208b.

Over the semiconductor substrate 201, a second contact liner film 209b of a silicon nitride film is formed to be integral with the first contact liner film 209a shown above and cover the second gate electrode 203b and the second sidewall spacer 218b. However, no slit is formed in the second contact liner film 209b. In this structure, the second contact liner film 209b has a thickness of 30 nm.

On the second contact liner film 209b, a second interlayer insulating film 210b is formed to be integral with the second interlayer insulating film 210a shown above. The second interlayer insulating film 210b is formed with a second contact plug 211b penetrating the second interlayer insulating film 210b and the second contact liner film 209b to reach not only the top surface of the semiconductor substrate 201 (to be more specific, the top surface of the second silicide layer 208b located in the upper layer of the second p-type deep source/drain region 207b) but also the side surface of the second sidewall spacer 218b. Although FIG. 4 shows the case where the second contact plug 211b reaches the top surface of the semiconductor substrate 201 and the side surface of the second sidewall spacer 218b, another case may be employed where the second contact plug 211b additionally reaches the top surface of the second gate electrode 203 to provide the MIS diode.

A method for fabricating a semiconductor device according to the second embodiment of the present invention will be described below with reference to the accompanying drawings.

—First Fabrication Method—

FIGS. 5A to 5C and 6A to 6C are sectional views showing main process steps of a first method for fabricating a semiconductor device according to the second embodiment of the present invention in the order of its fabrication steps. In FIGS. 5A to 5C and 6A to 6C, a detailed description of components of the PMIS transistors shown in the first area A (for example, a logic area) and the second area B (for example, a memory area) on the semiconductor substrate 201 will be simplified like the above description of their structure, and characteristic points of the first fabrication method will be described mainly.

Figure 5A:
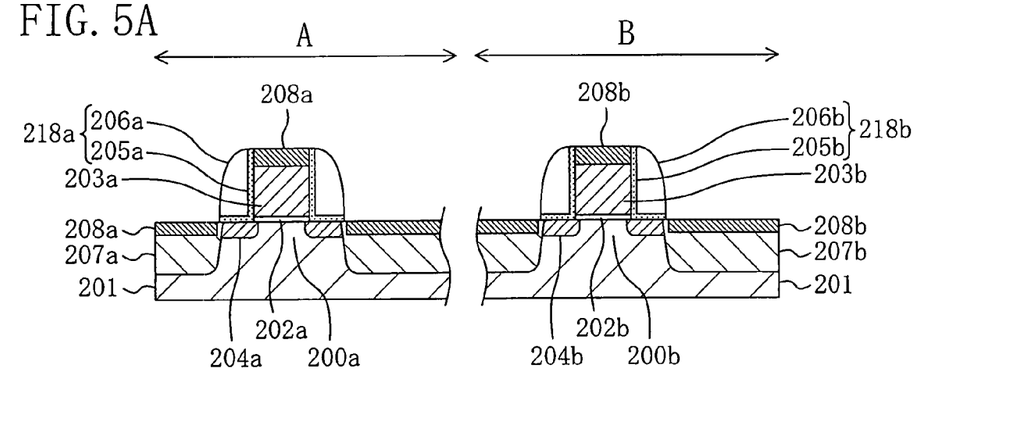
FIGS. 5A to 5C are sectional views showing main process steps of a first method for fabricating a semiconductor device according to the second embodiment of the present invention in the order of its fabrication steps.

Referring to FIG. 5A, first, in a region of the semiconductor substrate 201 surrounded with the isolation region (not shown), the n-well (not shown) is selectively formed by an ion implantation method to provide the first active region 200a in the first area A and the second active region 200b in the second area B. Subsequently, the first gate insulating film 202a and the first gate electrode 203a are formed on the first active region 200a, and also the second gate insulating film 202b and the second gate electrode 203b are formed on the second active region 200b. Using the first gate electrode 203a and the second gate electrode 203b as a mask, the first p-type shallow source/drain region 204a with a shallow junction depth is formed in a portion of the first active region 200a located below each side of the first gate electrode 203a, and also the second p-type shallow source/drain region 204b with a shallow junction depth is formed in a portion of the second active region 200b located below each side of the second gate electrode 203b.

Next, the first L-shaped insulating film 205a with an L-shaped cross section is formed on the side surfaces of the first gate insulating film 202a and the first gate electrode 203a, and the second L-shaped insulating film 205b with an L-shaped cross section is formed on the side surfaces of the second gate insulating film 202b and the second gate electrode 203b. Simultaneously with the formation of the first and second L-shaped insulating films 205a and 205b, the first sidewall 206a is formed on the inner surface of the first L-shaped insulating film 205a, and also the second sidewall 206b is formed on the inner surface of the second L-shaped insulating film 205b. In the manner described above, the first L-shaped insulating film 205a and the first sidewall 206a constitute the first sidewall spacer 218a, and the second L-shaped insulating film 205b and the second sidewall 206b constitute the second sidewall spacer 218b. Note that the first and second sidewalls 206a and 206b may each be formed of a stacked film.

Subsequently, using the first gate electrode 203a and the first sidewall spacer 218a as a mask, ions as a p-type impurity are implanted to form, in a portion of the first active region 200a located below an outer side of the first sidewall spacer 218a, a first p-type deep source/drain region 207a with a greater junction depth than the first p-type shallow source/drain region 204a. Also, using the second gate electrode 203b and the second sidewall spacer 218b as a mask, ions as a p-type impurity are implanted to form, in a portion of the second active region 200b located below an outer side of the second sidewall spacer 218b, the second p-type deep source/drain region 207b with a greater junction depth than the second p-type shallow source/drain region 204b.

A metal film of cobalt, nickel, or the like is deposited over the entire surface of the semiconductor substrate 201, and then the metal film is subjected to a thermal treatment to form the first silicide layer 208a in the upper layer of the first gate electrode 203a and the upper layer of the first p-type deep source/drain region 207a located outside the first sidewall spacer 218a, and also to form the second silicide layer 208b in the upper layer of the second gate electrode 203b and the upper layer of the second p-type deep source/drain region 207b located outside the second sidewall spacer 218b.

Figure 5B:
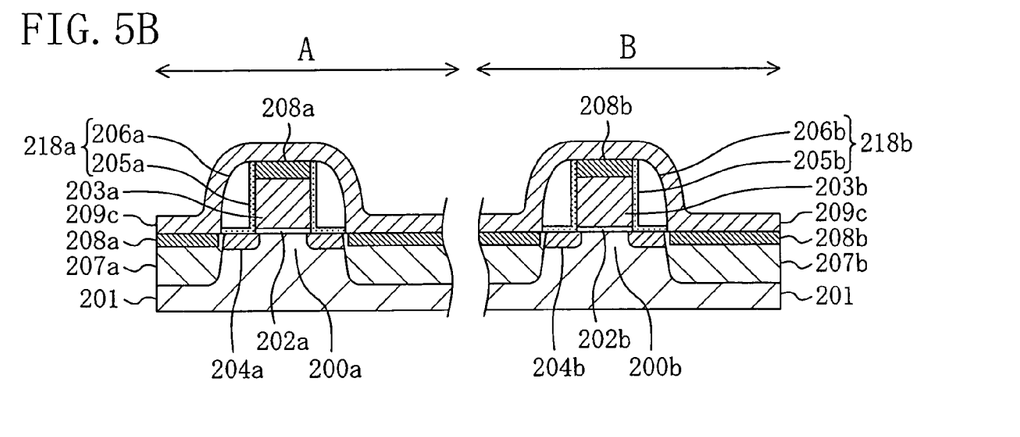

Next, as shown in FIG. 5B, by a plasma enhanced CVD method, the contact liner film 209c of a silicon nitride film with a thickness of 30 nm is deposited over the entire surface of the semiconductor substrate 201.

Figure 5C:
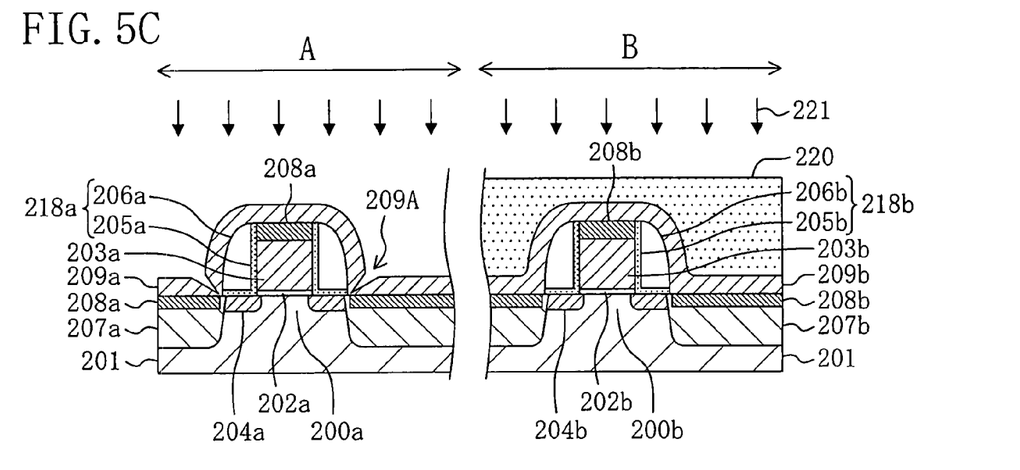

Subsequently, as shown in FIG. 5C, a photoresist pattern 220 is formed to cover a portion of the silicon nitride film located in the second area B, and then ultraviolet irradiation 221 is performed from the upper-surface side of the silicon nitride film using a light source with a wavelength of 200 to 400 nm. To be more specific, the wafer with the above-shown structure fabricated thereon is placed on a stage heated to 150° C., and in a nitrogen atmosphere, the wafer is subjected to ultraviolet irradiation 221 for 60 minutes using a light source with a wavelength of 200 nm. Thereby, as shown in FIG. 5C, on the single semiconductor substrate, the first area A is formed with the first contact liner film 209a having the slit 209A made by shrinking the silicon nitride film to a thickness of 25 nm, and the second area B is formed with the second contact liner film 209b having no slit and still having a thickness of 30 nm.

Instead of the ultraviolet irradiation shown in FIG. 5C, a thermal annealing may be performed to form the slit 209A.

Figure 6A:
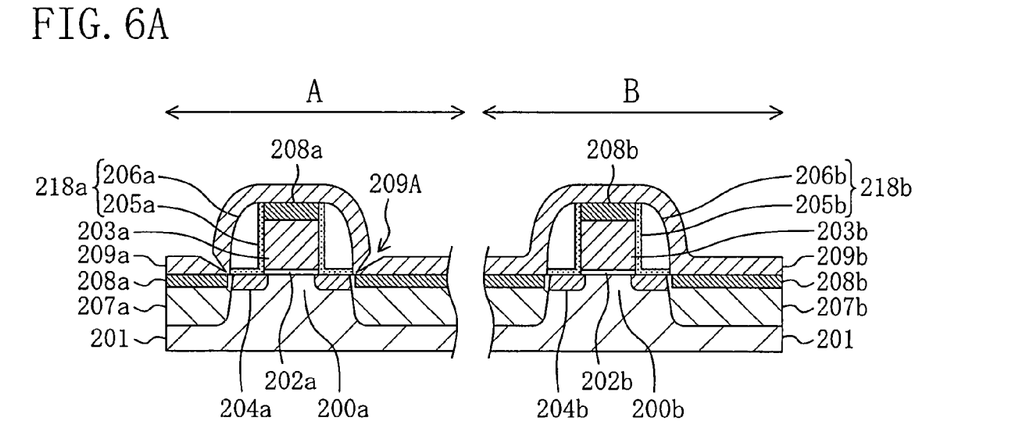
FIGS. 6A to 6C are sectional views showing main process steps of the first method for fabricating a semiconductor device according to the second embodiment of the present invention in the order of its fabrication steps.

Thereafter, the photoresist pattern 220 in the second area B is removed to provide the structure shown in FIG. 6A.

Figure 6B:
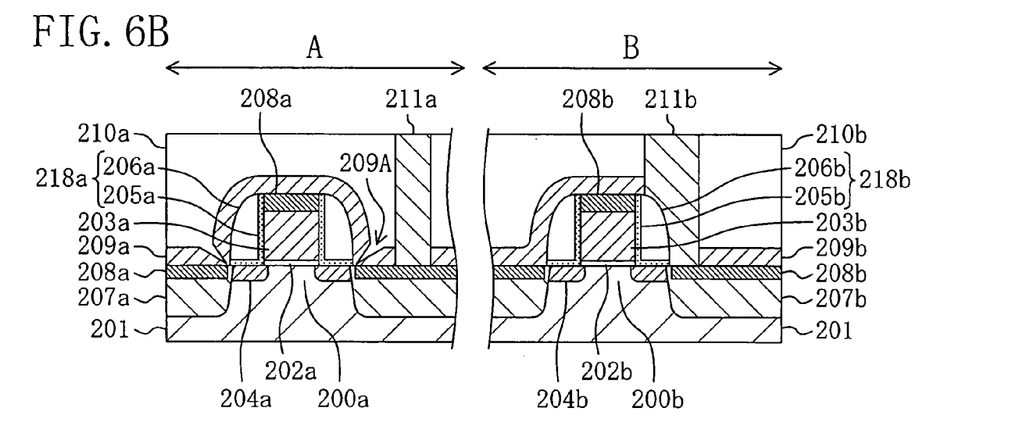

As shown in FIG. 6B, over the entire surface of the semiconductor substrate 201, for example, a silicon oxide film is deposited to cover the second contact liner film 209b and the first contact liner film 209a including the inside of the slit 209A, and then the surface of the formed film is planarized by CMP to form the first interlayer insulating film 210a in the first area A and the second interlayer insulating film 210b in the second area B.

Next, by lithography and dry etching techniques, the first interlayer insulating film 210a in the first area A is formed with a first contact hole which penetrates the first interlayer insulating film 210a and the first contact liner film 209a to expose the first silicide layer 208a located in the upper layer of the first p-type deep source/drain region 207a of the semiconductor substrate 201, and also the second interlayer insulating film 210b in the second area B is formed with a second contact hole which penetrates the second interlayer insulating film 210b and the second contact liner film 209b to expose not only the second silicide layer 208b located in the upper layer of the second p-type deep source/drain region 207b of the semiconductor substrate 201 but also the side surface of the second sidewall spacer 218b. Like the first embodiment described above, preferably, the formation process of the first and second contact holes is divided into two steps composed of: the step of etching the silicon oxide film constituting the first and second interlayer insulating films 210a and 210b; and the subsequent step of etching the first and second contact liner films 209a and 209b.

Subsequently, the first and second contact holes are filled with a conductive film of tungsten or the like. Thereby, the first area A is formed with the first contact plug 211a reaching the top surface of the first silicide layer 208a, and the second area B is formed with the second contact plug 211b reaching not only the top surface of the second silicide layer 208b but also the side surface of the second sidewall spacer 218b. Although FIG. 6B shows the case where the second contact plug 211b reaches the top surface of the semiconductor substrate 201 and the side surface of the second sidewall spacer 218b, this contact-hole formation process can also be carried out so that the second contact plug 211b additionally reaches the top surface of the second gate electrode 203 to provide the MIS diode.

Figure 6C:
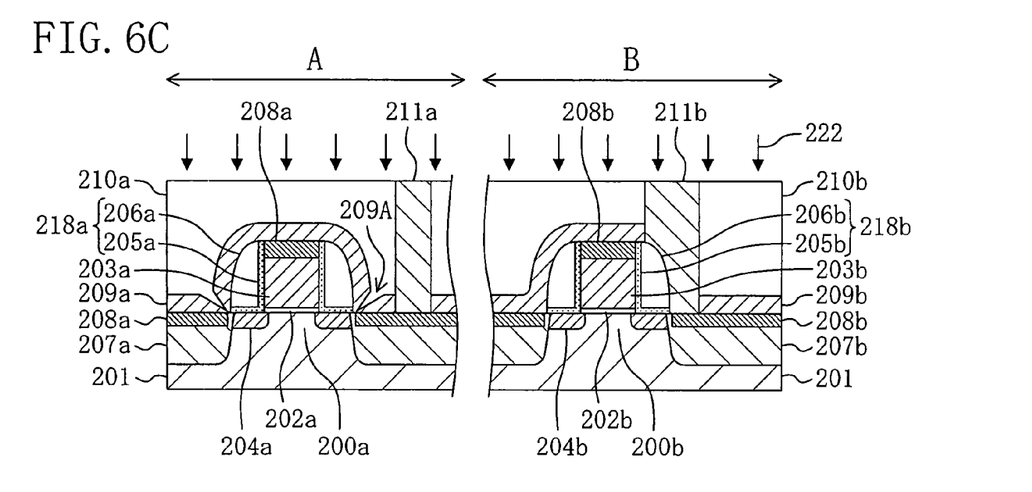

Then, as shown in FIG. 6C, the semiconductor substrate 201 is subjected to hydrogen sintering 222. The hydrogen sintering 222 is performed in an atmosphere of $H_2:N_2=1:1$, at 400° C., and for 30 minutes.

—Second Fabrication Method—

FIGS. 7A to 7C, 8A to 8C, and 9A to 9C are sectional views showing main process steps of a second method for fabricating a semiconductor device according to the second embodiment of the present invention in the order of its fabrication steps. In the following description, explanation of processes in common with the first fabrication method mentioned above will be simplified.

Figure 7A:
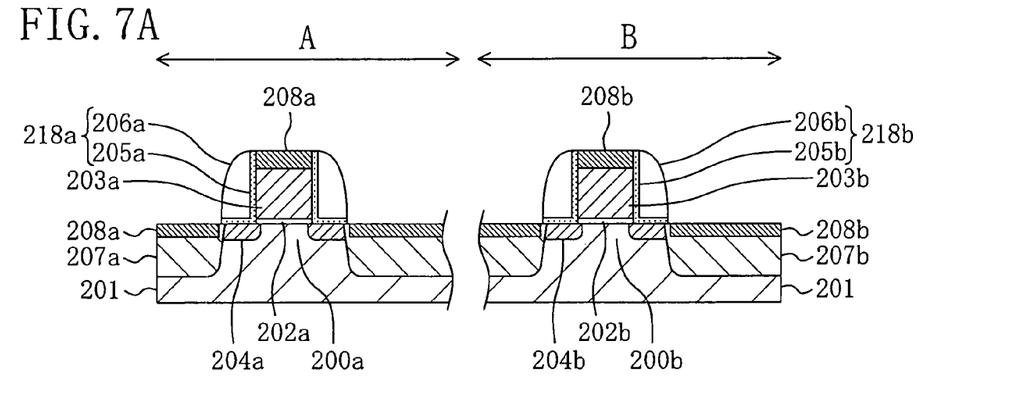
FIGS. 7A to 7C are sectional views showing main process steps of a second method for fabricating a semiconductor device according to the second embodiment of the present invention in the order of its fabrication steps.

First, the step shown in FIG. 7A is carried out in the same manner as the above description using FIG. 5A, thereby forming the structure shown in FIG. 7A.

Figure 7B:
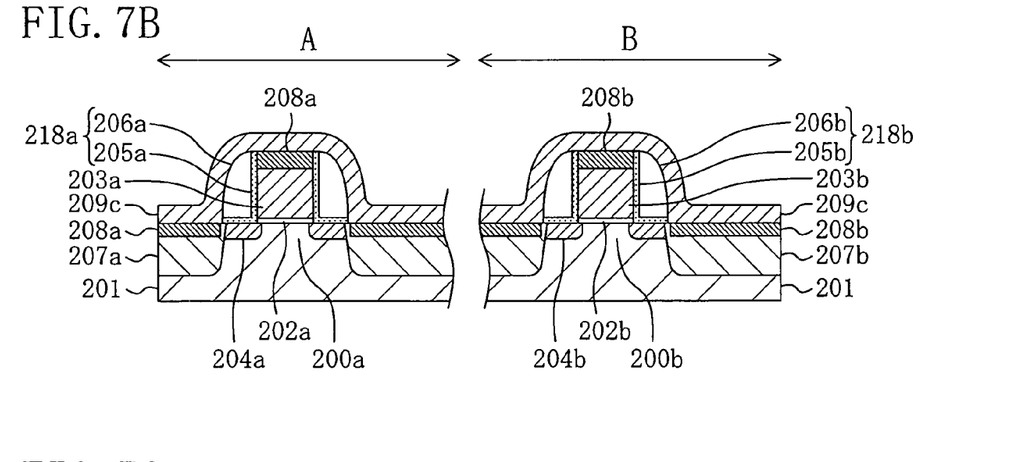

Next, as shown in FIG. 7B, by an ALD (atomic layer deposition) method, over the entire surface of the semiconductor substrate 201, the contact liner film 209c of a silicon nitride film with a thickness of 25 nm is deposited to cover the first gate electrode 203a, the first sidewall spacer 218a, the second gate electrode 203b, and the second sidewall spacer 218b. In this step, no slit is formed in the contact liner film 209c.

Figure 7C:
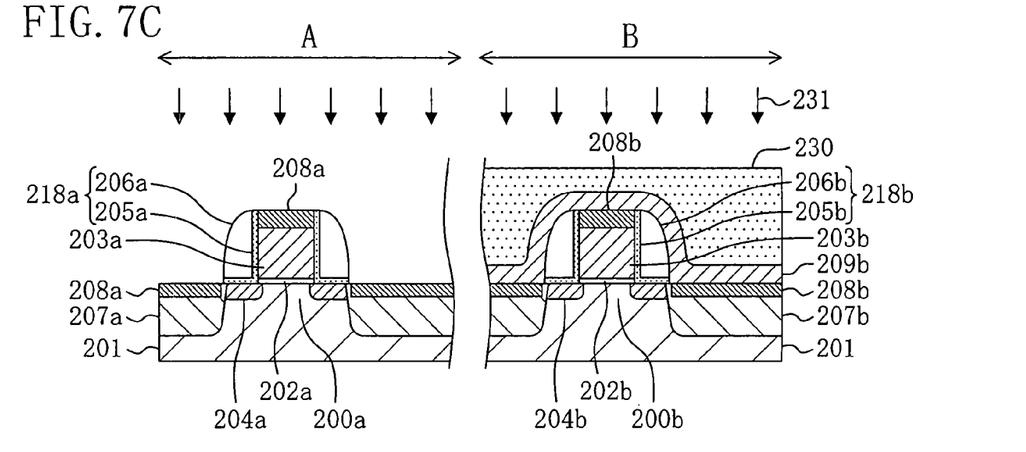

Subsequently, as shown in FIG. 7C, in the second area B, a photoresist pattern 230 is formed on the contact liner film 209c, and then by an etching 231 using the photoresist pattern 230 as a mask, the contact liner film 209 in the first area A is removed. Thereby, the second contact liner film 209b with no slit is formed in the second area B.

Figure 8A:
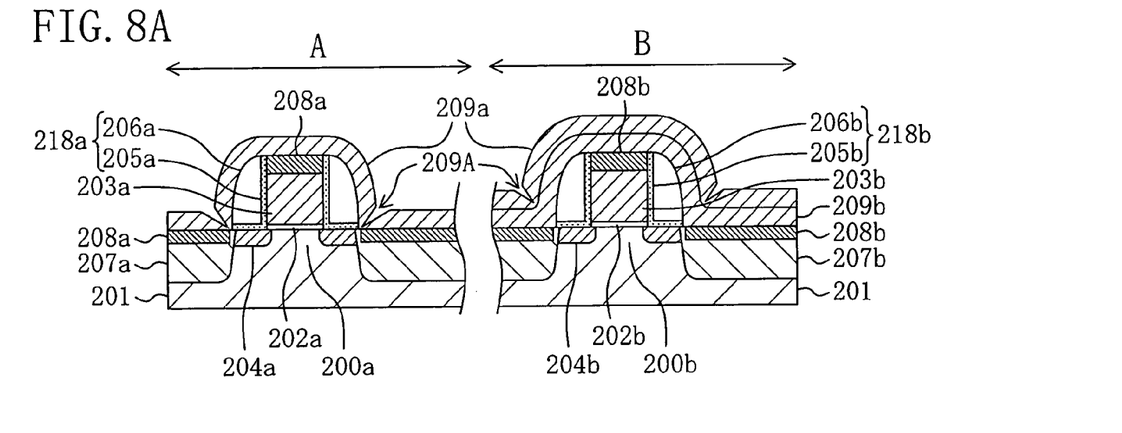
FIGS. 8A to 8C are sectional views showing main process steps of the second method for fabricating a semiconductor device according to the second embodiment of the present invention in the order of its fabrication steps.

As shown in FIG. 8A, after removal of the photoresist pattern 230, a silicon nitride film with a thickness of 30 nm is deposited over the entire surface of the semiconductor substrate 201 to cover the first gate electrode 203a, the first sidewall spacer 218a, and the second contact liner film 209b. This deposition is performed by a plasma enhanced CVD method at a deposition temperature of 250 to 600° C. inclusive. Thereafter, the atmosphere is cooled to room temperature to form the first contact liner film 209a with the slit 209A in both of the first area A and the second area B. In this step, description has been made of the case where the first contact liner film 209a is formed by shrinking the silicon nitride film. Alternatively, the formation process can be modified to form the slit 209A during deposition of the plasma-CVD nitride film.

Figure 8B:
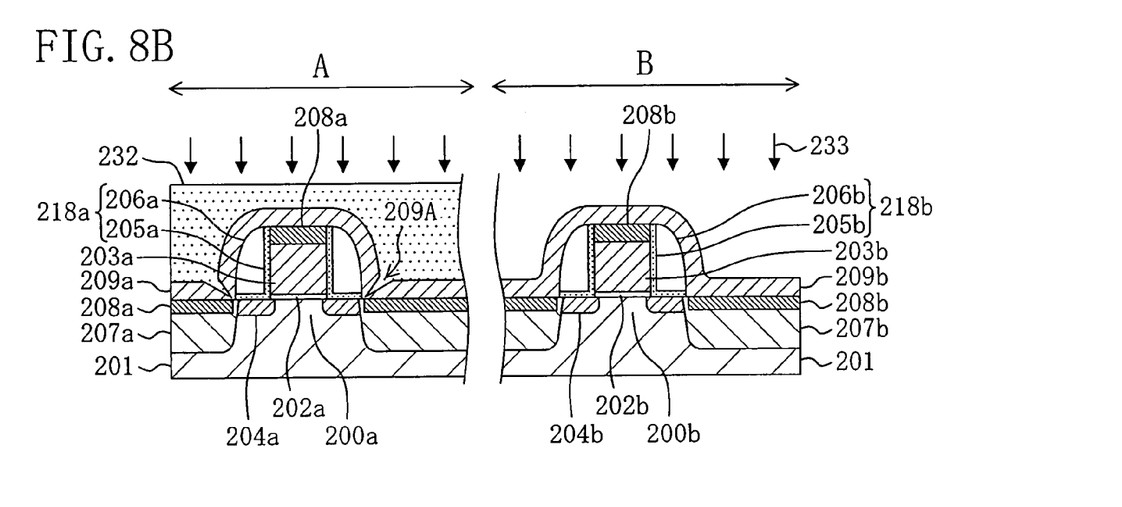

Next, as shown in FIG. 8B, in the first area A, a photoresist pattern 232 is formed on the first contact liner film 209a, and then by an etching 233 using the photoresist pattern 232 as a mask, a portion of the first contact liner film 209a lying in the second area B is removed.

Figure 8C:
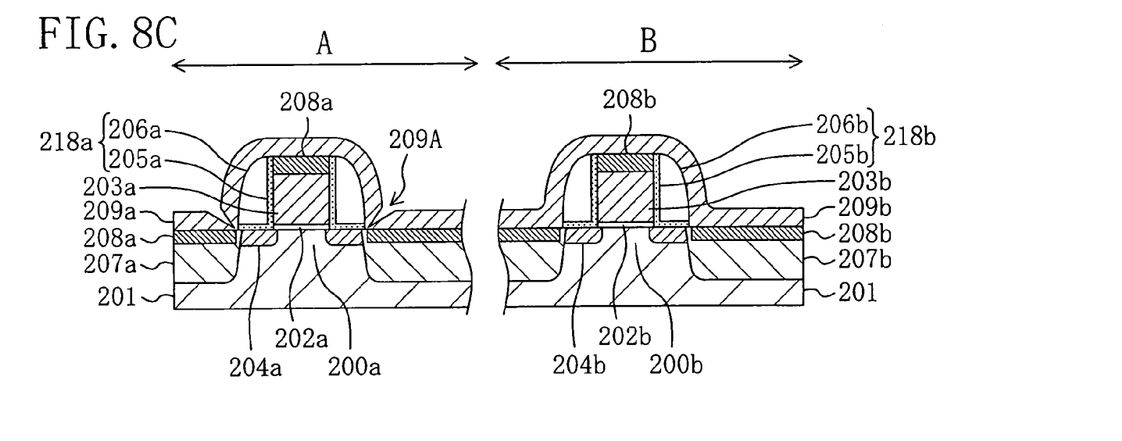

Subsequently, as shown in FIG. 8C, the photoresist pattern 232 is removed to provide the structure shown in FIG. 8C. Specifically, as shown in FIG. 8C, on the same semiconductor substrate, the first area A is formed with the first contact liner film 209a having the slit 209A made by shrinking the silicon nitride film to a thickness of 25 nm, and the second area B is formed with the second contact liner film 209b having no slit and still having a thickness of 25 nm.

Figure 9A:
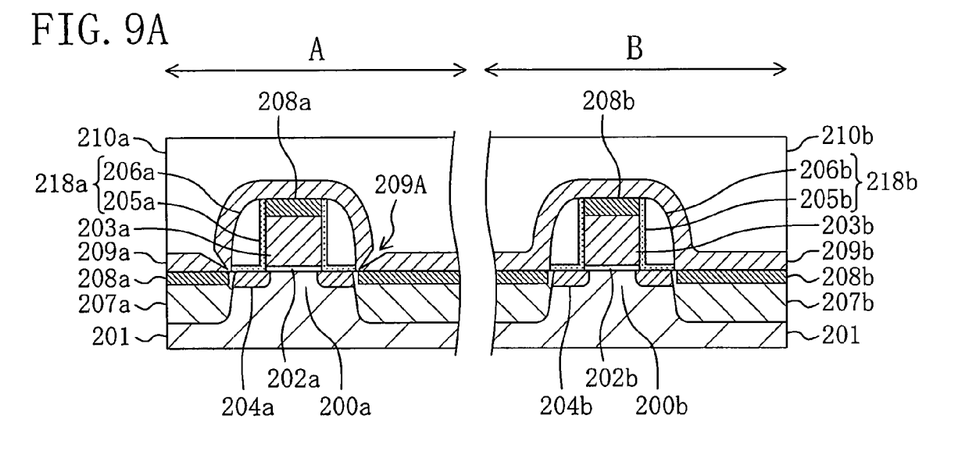
FIGS. 9A to 9C are sectional views showing main process steps of the second method for fabricating a semiconductor device according to the second embodiment of the present invention in the order of its fabrication steps.

As shown in FIG. 9A, over the entire surface of the semiconductor substrate 201, for example, a silicon oxide film is deposited to cover the second contact liner film 209b and the first contact liner film 209a including the inside of the slit 209A, and then the surface of the formed film is planarized by CMP to form the first interlayer insulating film 210a in the first area A and the second interlayer insulating film 210b in the second area B.

Figure 9B:
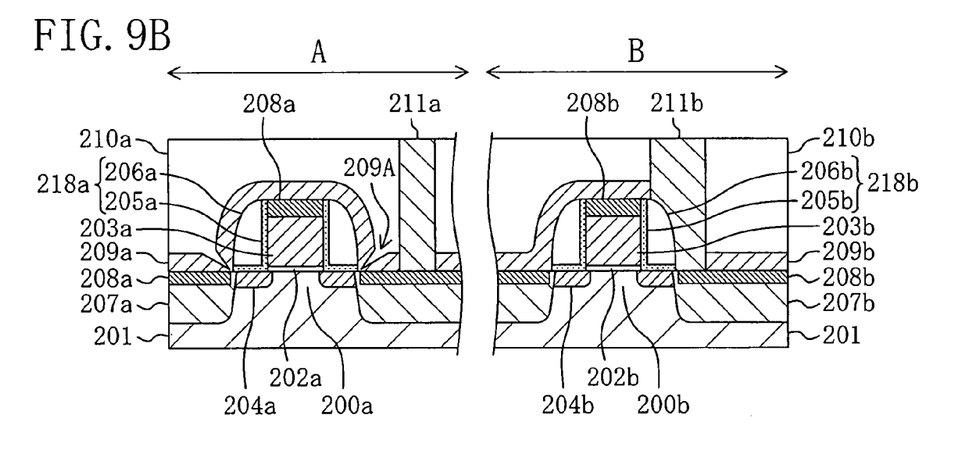

Next, as shown in FIG. 9B, by lithography and dry etching techniques, the first interlayer insulating film 210a in the first area A is formed with a first contact hole which penetrates the first interlayer insulating film 210a and the first contact liner film 209a to expose the first silicide layer 208a located in the upper layer of the first p-type deep source/drain region 207a of the semiconductor substrate 201, and also the second interlayer insulating film 210b in the second area B is formed with a second contact hole which penetrates the second interlayer insulating film 210b and the second contact liner film 209b to expose not only the second silicide layer 208b located in the upper layer of the second p-type deep source/drain region 207b of the semiconductor substrate 201 but also the side surface of the second sidewall spacer 218b. Like the first embodiment described above, preferably, the formation process of the first and second contact holes is divided into two steps composed of: the step of etching the silicon oxide film constituting the first and second interlayer insulating films 210a and 210b; and the subsequent step of etching the first and second contact liner films 209a and 209b.

Subsequently, the first and second contact holes are filled with a conductive film of tungsten or the like. Thereby, the first area A is formed with the first contact plug 211a reaching the top surface of the first silicide layer 208a, and also the second area B is formed with the second contact plug 211b reaching not only the top surface of the second silicide layer 208b but also the side surface of the second sidewall spacer 218b. Although FIG. 9B shows the case where the second contact plug 211b reaches the top surface of the semiconductor substrate 201 and the side surface of the second sidewall spacer 218b, this contact-hole formation process can also be carried out so that the second contact plug 211b additionally reaches the top surface of the second gate electrode 203 to provide the MIS diode.

Figure 9C:
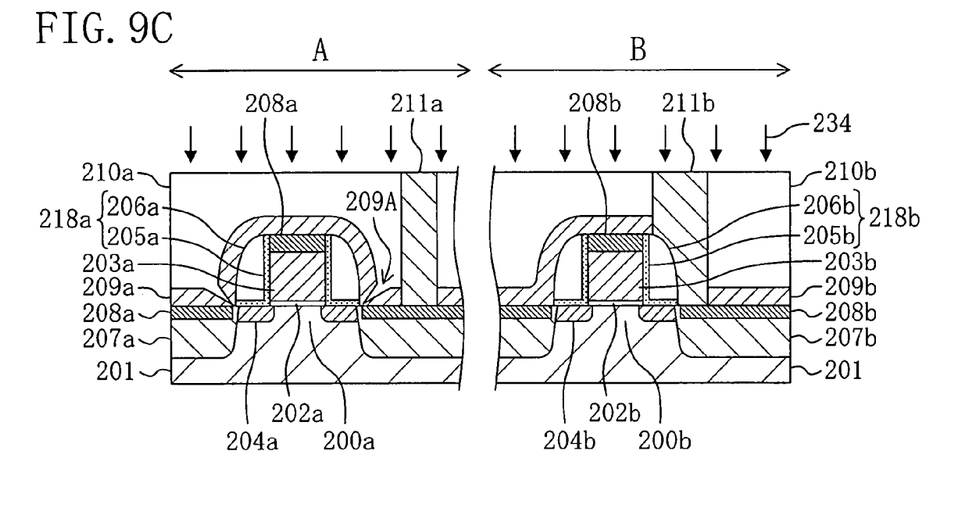

Then, as shown in FIG. 9C, the semiconductor substrate 201 is subjected to hydrogen sintering 234. The hydrogen sintering 234 is performed in an atmosphere of $H_2:N_2=1:1$, at 400° C., and for 30 minutes.

As described above, with the semiconductor device and the first and second fabrication methods thereof according to the second embodiment of the present invention, in the first area A, the first contact liner film 209a with the slit 209A is formed to secure, as a hydrogen diffusion path for supplying hydrogen to the first gate insulating film 202a, not only a hydrogen diffusion path passing through the first contact plug 211a to the first gate insulating film 202a but also a hydrogen diffusion path passing through the slit 209A to the gate insulating film 202a. With this structure, in the hydrogen sintering process (see FIGS. 6C and 9C) carried out after formation of the first and second contact plugs 211a and 211b in order to recover damages in the first and second gate insulating films 202a and 202b, hydrogen supply to the first gate insulating film 202a can be effectively performed through these hydrogen diffusion paths. This makes it possible to supply hydrogen to the first gate insulating film 202a regardless of the thickness of the first contact liner film 209a. Therefore, even though the first and second contact liner films 209a and 209b are made thin, the reliability of the PMIS transistor in the first area A can be improved especially with NBTI of the PMIS transistor prevented from deteriorating.

On the other hand, in the second area B, no slit is provided in the second contact liner film 209b. Therefore, the etching resistance in forming the second contact plug 211b can be improved to suppress an increase in leakage current resulting from the contact. In addition to this, in the hydrogen sintering process (see FIGS. 6C and 9C), the second contact plug 211b reaching not only the second silicide layer 208b but also the side surface of the second sidewall spacer 218b serves as a hydrogen supply path to the second gate insulating film 202b, so that it corresponds to the path through the slit 209A in the first area A. As a result of this, like the first gate insulating film 202a, the second gate insulating film 202b can be recovered from damages.

As described above, in the case where like an area (the first area A) typified by an area formed with a logic transistor, the first contact plug 211a is formed on the first silicide layer 208a, the first contact liner film 209a with the slit 209A is formed in order to improve the reliability of the PMIS transistor. On the other hand, in the case where like an area (the second area B) typified by an area formed with a memory area, the second contact plug 211b is formed not only on the silicide layer but also on the second sidewall spacer 218b, the second contact liner film 209b with no slit is formed in order to prevent an increase in leakage current caused by penetrating the second contact plug 211b into the semiconductor substrate 201.

As is apparent from the above, the structure made by changing the shape of the contact liner film according to the shape and the formation position of the corresponding contact plug can be employed to fabricate, on a single chip, both of the region where improvement of reliability of the transistor therein is demanded and the region where reduction of leakage current is demanded.

Moreover, with the second formation method of the semiconductor device according to the second embodiment of the present invention, the first and second contact liner films 209a and 209b can be formed independently in the first and second areas A and B, respectively, unlike the first fabrication method. Therefore, the optimized first and second contact liner films 209a and 209b can be formed in the first and second areas A and B, respectively.

In the second embodiment of the present invention, like the first embodiment, the first and second contact liner films 209a and 209b are not limited to the above-shown thicknesses and material. For example, a silicon nitride film containing hydrogen may be used as the first contact liner film 209a.

In addition, like the first embodiment described above, the first and second sidewall spacers 218a and 218b may be formed of only the first and second sidewalls 206a and 206b, respectively. An insulating film (an offset spacer) with an I-shaped cross section may be formed between the first gate electrode 203a and the first sidewall spacer 218a and between the second gate electrode 203b and the second sidewall spacer 218b.

As described above, the present invention is useful for recovery of damages in a gate insulating film of a semiconductor device using a contact liner film.

What is claimed is:

1. A semiconductor device comprising a first p-type MIS transistor over a first active region of a semiconductor substrate,
    wherein the first p-type MIS transistor comprises:
    a first gate insulating film formed on the first active region;
    a first gate electrode formed on the first gate insulating film;
    a first side-wall insulating film formed on a side surface of the first gate electrode;
    a first p-type source/drain region in the first active region outside the first side-wall insulating film;
    a first contact liner film formed over the first active region to cover the first gate electrode and the first side-wall insulating film;
    a first interlayer insulating film formed on the first contact liner film; and
    a first contact plug formed to penetrate the first interlayer insulating film and the first contact liner film and reach the top surface of the first source/drain region,
    wherein the first contact liner film has a slit extending slantwise, around a corner at which the side surface of the first side-wall insulating film intersects the top surface of the first active region, from a corner located on the top surface of the first contact liner film toward a corner located on the bottom surface of the first contact liner film, and
    in the slit, the first interlayer insulating film is embedded.

2. The device of claim 1, wherein the first side-wall insulating film includes: an L-shaped insulating film with an L-shaped cross section formed on the side surface of the first gate electrode and the top surface of the first active region; and a sidewall formed on the inner surface of the L-shaped insulating film.

3. The device of claim 1, further comprising a first silicide layer formed in an upper portion of the first p-type source/drain region,
    wherein the first contact plug is formed to reach the first silicide layer.

4. The device of claim 1, further comprising a second p-type MIS transistor over a second active region of the semiconductor substrate, the second active region differing from the first active region,
    wherein the second p-type MIS transistor comprises:
    a second gate insulating film formed on the second active region;
    a second gate electrode formed on the second gate insulating film;
    a second side-wall insulating film formed on a side surface of the second gate electrode;
    a second p-type source/drain region in the second active region outside the second side-wall insulating film;
    a second contact liner film formed over the second active region to cover the second gate electrode and the second side-wall insulating film;
    a second interlayer insulating film formed on the second contact liner film; and
    a second contact plug formed to penetrate the second interlayer insulating film and the second contact liner film and reach the top surface of the second source/drain region and the side surface of the second side-wall insulating film,
    wherein the first contact plug is formed to reach only the top surface of the first source/drain region, and
    the second contact liner film has no slit extending, around a corner at which the side surface of the second side-wall insulating film intersects the top surface of the second active region, from the top surface of the second contact liner film toward the corner.

5. The device of claim 4, further comprising a second silicide layer formed in an upper portion of the second p-type source/drain region,
    wherein the second contact plug is formed to reach the second silicide layer.

6. The device of claim 1, wherein the first contact liner film is made of a silicon nitride film.

7. The device of claim 1, wherein the first contact liner film is made of a silicon nitride film containing hydrogen.

8. A method for fabricating a semiconductor device, comprising:
    the step (a) of forming a first gate insulating film on a first active region of a semiconductor substrate;
    the step (b) of forming a first gate electrode on the first gate insulating film;
    the step (c) of forming a first side-wall insulating film on a side surface of the first gate electrode;
    the step (d) of forming a first p-type source/drain region in the first active region outside the first side-wall insulating film;
    the step (e) of forming a first contact liner film over the first active region to cover the first gate electrode and the first side-wall insulating film;
    the step (f) of forming a slit in the first contact liner film, the slit extending slantwise, around a corner at which the side surface of the first side-wall insulating film intersects the top surface of the first active region, from a corner located on the top surface of the first contact liner film toward a corner located on the bottom surface of the first contact liner film;
    the step (g) of forming, after the step (f), a first interlayer insulating film on the first contact liner film;
    the step (h) of forming a first contact plug to penetrate the first interlayer insulating film and the first contact liner film and reach the top surface of the first source/drain region; and the step (i) of subjecting, after the step (h), the semiconductor substrate to a thermal annealing in a hydrogen atmosphere, wherein in the step (g), in the slit, the first interlayer insulating film is embedded.

9. The method of claim 8, further comprising, after the step (d) and before the step (e), the step (j) of forming a first silicide layer on the first p-type source/drain region, wherein in the step (h), the first contact plug is formed to reach the first silicide layer.

10. The method of claim 8, wherein the step (a) further includes the step of forming a second gate insulating film on a second active region of a semiconductor substrate, the second active region differing from the first active region, the step (b) further includes the step of forming a second gate electrode on the second gate insulating film, the step (c) further includes the step of forming a second side-wall insulating film on a side surface of the second gate electrode, the step (d) further includes the step of forming a second p-type source/drain region in the second active region outside the second side-wall insulating film, the step (e) further includes the step of forming a second contact liner film over the second active region to cover the second gate electrode and the second side-wall insulating film, the step (g) further includes the step of forming a second interlayer insulating film on the second contact liner film, the step (h) is the step of forming the first contact plug to reach only the top surface of the first source/drain region, and also a second contact plug to penetrate the second interlayer insulating film and the second contact liner film and reach the top surface of the second source/drain region and the side surface of the second side-wall insulating film, and the second contact liner film has no slit extending, around a corner at which the side surface of the second side-wall insulating film intersects the top surface of the second active region, from the top surface of the second contact liner film toward the corner.

11. The method of claim 8, wherein the step (e) is the step of forming the first contact liner film made of a silicon nitride film.

12. The method of claim 8, wherein the step (e) is the step of forming the second contact liner film made of a silicon nitride film containing hydrogen.

13. The method of claim 8, wherein in the step (f), the first contact liner film is subjected to ultraviolet irradiation to form the slit in the first contact liner film.

* * * * *